(12) United States Patent
Akram

(10) Patent No.: US 6,458,625 B2
(45) Date of Patent: *Oct. 1, 2002

(54) MULTI CHIP SEMICONDUCTOR PACKAGE AND METHOD OF CONSTRUCTION

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/836,609

(22) Filed: Apr. 17, 2001

Related U.S. Application Data

(63) Continuation of application No. 09/167,258, filed on Oct. 6, 1998, now Pat. No. 6,261,865.

(51) Int. Cl.[7] .......................... H01L 21/44; H01L 21/48
(52) U.S. Cl. .................. 438/111; 438/106; 438/118; 438/123
(58) Field of Search ................................ 438/106, 107, 438/111, 118, 123

(56) References Cited

U.S. PATENT DOCUMENTS

| | | |
|---|---|---|
| 4,264,917 A | 4/1981 | Ugon |
| 4,862,245 A | 8/1989 | Pashby et al. |
| 5,012,323 A | 4/1991 | Farnworth |
| 5,146,308 A | 9/1992 | Chance et al. |
| 5,147,815 A | 9/1992 | Casto |
| 5,229,647 A | 7/1993 | Gnadinger |
| 5,239,198 A | 8/1993 | Lin et al. |
| 5,252,857 A | 10/1993 | Kane et al. |
| 5,266,833 A | 11/1993 | Capps |
| 5,291,061 A | 3/1994 | Ball |
| 5,323,060 A | 6/1994 | Fogal et al. |
| 5,399,898 A | 3/1995 | Rostoker |
| 5,422,435 A | 6/1995 | Takiar et al. |
| 5,438,224 A | 8/1995 | Papageorge et al. |
| 5,471,369 A | * 11/1995 | Honda et al. ................ 361/813 |
| 5,483,024 A | 1/1996 | Russell et al. |
| 5,484,959 A | 1/1996 | Burns |
| 5,592,019 A | 1/1997 | Ueda et al. |
| 6,261,865 B1 | * 7/2001 | Akram ........................ 438/111 |

FOREIGN PATENT DOCUMENTS

| | | | |
|---|---|---|---|
| JP | 56-62351 A | 5/1981 |
| JP | 62-126661 A | 6/1987 |
| JP | 1-28856 A | 1/1989 |
| JP | 3-169062 A | 7/1991 |

* cited by examiner

*Primary Examiner*—Amir Zarabian
*Assistant Examiner*—Brad Smith
(74) *Attorney, Agent, or Firm*—TraskBritt

(57) ABSTRACT

A multi-chip semiconductor package using a lead-on-chip lead frame. The lead-on-chip package places two or more lead-on-chip dice into one package that are either attached to their own lead-on-chip lead frame or are mounted to the same lead-on-chip lead frame and subsequently wire bonded to provide electrical connection from the dice to the lead frame while in substantially the same arrangement without requiring the assembly of the multiple semiconductor dice and lead frame to be flipped for additional wire bonding attachment of the dice to the lead frame.

5 Claims, 4 Drawing Sheets

MULTI CHIP SEMICONDUCTOR PACKAGE AND METHOD OF CONSTRUCTION

CROSS-REFERENCE TO RELATED APPLICATION

This application is a continuation of U.S. application Ser. No. 09/167,258, filed Oct. 6, 1998, now U.S. Pat. No. 6,261,865 B1, issued Jul. 17, 2001.

BACKGROUND OF THE INVENTION

1. Field of the Invention

The present invention relates generally to semiconductor packaging and, more particularly, to a method and apparatus for providing multi-chip chip semiconductor device (die) packages.

2. Statement of the Art

Integrated circuit devices proceed through a complicated and time-consuming fabrication routine before being completed and ready for packaging. Once this integrated circuit device passes final inspection for acceptability, it is passed to packaging. The integrated circuit device (IC) then is typically encapsulated in a protective package made of plastic, metal, ceramic material, or combinations thereof. The package is sealed to insulate the semiconductor die from the effects of temperature extremes, humidity and unintentional electrical contacts. The package has a plurality of conductive leads protruding from the encapsulation material for connecting to external devices on a printed circuit board. Various types of semiconductor packages include sealed metal cans, plastic and ceramic dual in-line packages, small outlining packages, single in-line packages, surface mount packages, and various other flat packages.

One type of semiconductor device assembly is a lead-on-chip (LOC) assembly as shown in the prior art drawing FIG. 1. In drawing FIG. 1, a strip 10 of lead frames 12 is provided. Located in a center portion of each lead frame 12 is a semiconductor die 14 attached to the lead fingers 16, typically by way of wire bonds. An example of a single semiconductor die 14 being attached to a lead frame 12 is shown in prior art drawing FIG. 2. The wire bonds 18 connect the semiconductor die 14 to the lead fingers 16 of the lead frame 12. Next, the lead fingers 16 are trimmed and an encapsulant material is applied over the semiconductor die 14 and portions of lead fingers 16 to completely encapsulate and seal wire bonds 18, portions of lead fingers 16, and semiconductor die 14, making a single chip package.

There is a need to increase the semiconductor die density of a semiconductor package to include two or more semiconductor dice in one package. A high density package having multiple semiconductor dice therein increases the electronic component density on a printed circuit board. Such a high density semiconductor package also maximizes space utilization on a printed circuit board and further increases the number of active elements on the printed circuit board. U.S. Pat. No. 5,483,024, entitled "High Density Semiconductor Package," issued Jan. 9, 1996, discloses a high density semiconductor package, an example of which is depicted in the prior art drawing FIG. 3. In the '024 Patent, two semiconductor dice 14 are fixed on the lead fingers 16 of a corresponding one of two lead frames 12. The semiconductor dice 14 and the lead frames 12 are then encapsulated (not shown) wherein a portion of the lead frames protrude and extend from the package. Wire bonds 18 electrically connect each semiconductor die 14 to its respective lead frame 12. An adhesive material 20 is used to bond the back surfaces of semiconductor dice 14 to one another. The high density semiconductor package illustrated in the '024 Patent does achieve a multi-chip package, but there are shortcomings in the manufacture of the same.

One problem is that a first semiconductor die must be attached to its lead frame and then electrically connected with the wire bonds 18. The two or more semiconductor dice 14 are adhered one to another. Once they are attached, the semiconductor dice 14 must be carried in an open basket that does not provide great rigidity that otherwise leads to poor wire bonding during the wire bonding process. A strong base support is necessary in order to provide a wire bond application that does not have weaknesses that lead to subsequent electrical or mechanical failure.

Another disadvantage with the '024 Patent disclosure is that the semiconductor device assembly must be flipped in order to do the wire bonding on the second surface. This exposes the delicate wire bonds on the first surface of the first semiconductor die to risks of detachment that may occur due to the stressing that results while wire bonding the second surface of the second semiconductor die as the assembly is held in a less than desirable open support structure. Thus, it would be desirable to be able to use a wire bonding process where the wire bonds are made between both the first semiconductor die and the second semiconductor die and their respective lead frames from the same access point.

Other types of multiple chip modules have been developed in the prior art. Another example is shown in U.S. Pat. No. 5,422,435, entitled "Stacked Multi Chip Modules and Method of Manufacturing," issued Jun. 6, 1995. The '435 Patent discloses a circuit assembly that includes a semiconductor die having substantially parallel opposing first and second surfaces and at least one electrical contact mounted on the first surface. The multiple semiconductor dice are stacked one on top another or adjacent one another in a tandem position and then are electrically connected using wire bonds to a lead frame attached to a base substrate. The '435 Patent allows the wire bonding between multiple semiconductor dice to be performed during the same operation, but the use of a very complicated substrate with a lead frame assembly requires a larger semiconductor die than otherwise desired as well as a much more complicated assembly process of attaching the semiconductor devices and any other intervening elements in a stack arrangement to the carrier substrate that includes the lead frame. No lead fingers of the lead frame are directly connected to the semiconductor die, such as in the '024 Patent previously described. Thus, the '435 Patent does not have the same advantages as using a lead-on-chip configuration as is achieved in the '024 Patent.

Another multi-chip stacked device arrangement is depicted in U.S. Pat. No. 5,291,061, entitled "Multi Chip Stacked Devices," issued Mar. 1, 1994, and commonly assigned with the present invention. The '061 Patent discloses multiple stacked die devices attached to a main substrate. Each stacked semiconductor die device is then electrically connected using wire bonds to a separate lead frame, which is not attached to the main substrate. The '061 Patent suffers from the same problem previously described in that it is not easily assembled using the improved lead-on-chip lead frame and the devices are stacked one on top another so as to make wire bonding difficult or done in stages after the addition of each subsequent die device.

SUMMARY OF THE INVENTION

The present invention is directed to a multi-chip semiconductor device package using a lead-on-chip lead frame configuration. The lead-on-chip multi-chip semiconductor device package places two or more lead-on-chip semiconductor dice into one package that are either attached to their own lead-on-chip lead frame or are mounted to the same lead-on-chip lead frame and subsequently wire bonded to provide electrical connection from the dice to the lead frame while in substantially the same arrangement without requiring the assembly of the multiple semiconductor dice and lead frame to be flipped for additional wire bonding attachment of the dice to the lead frame.

DETAILED DESCRIPTION OF THE PREFERRED EMBODIMENTS

Figure 1:
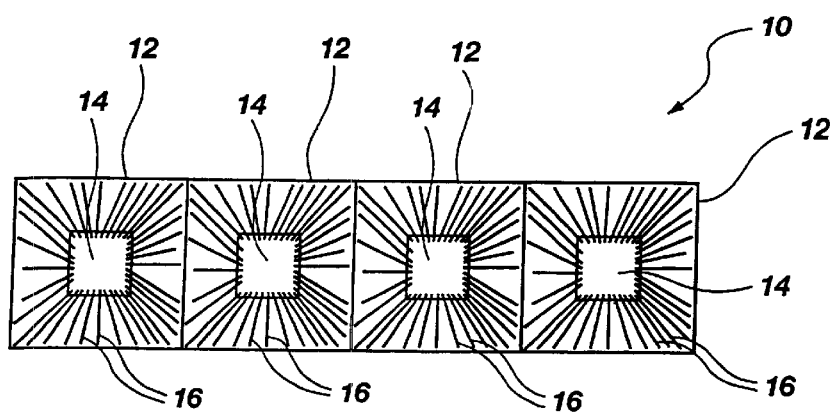
FIG. 1 schematic diagram of a prior art assembly of a lead frame tape.
Figure 2:
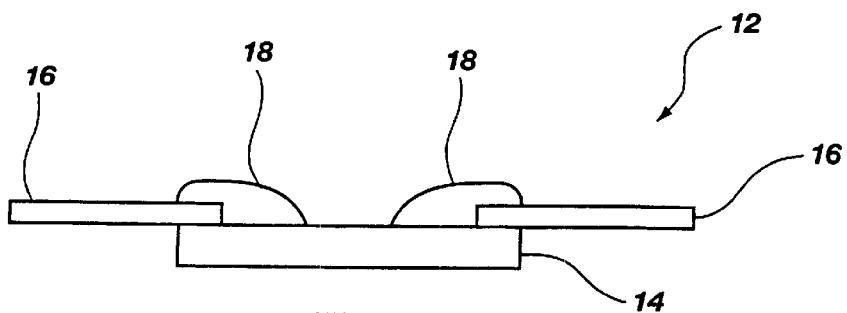
FIG. 2 is a cross-sectional schematic diagram of a prior art package of a lead-on-chip assembly having a single semiconductor device.
Figure 3:
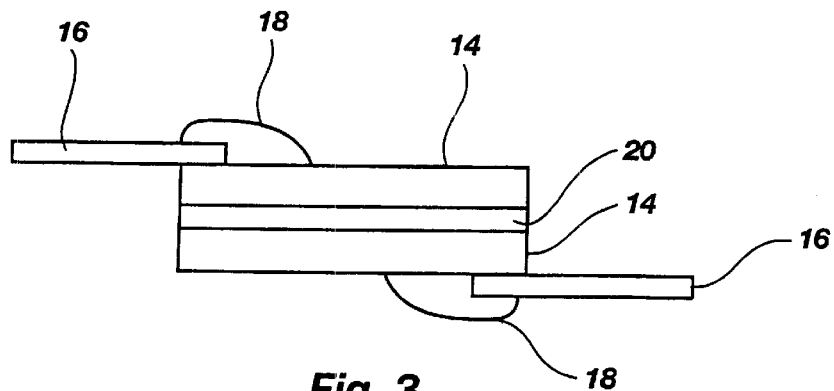
FIG. 3 is a cross-sectional schematic diagram of a multi-chip lead-on-chip assembly according to the prior art.
Figure 4:
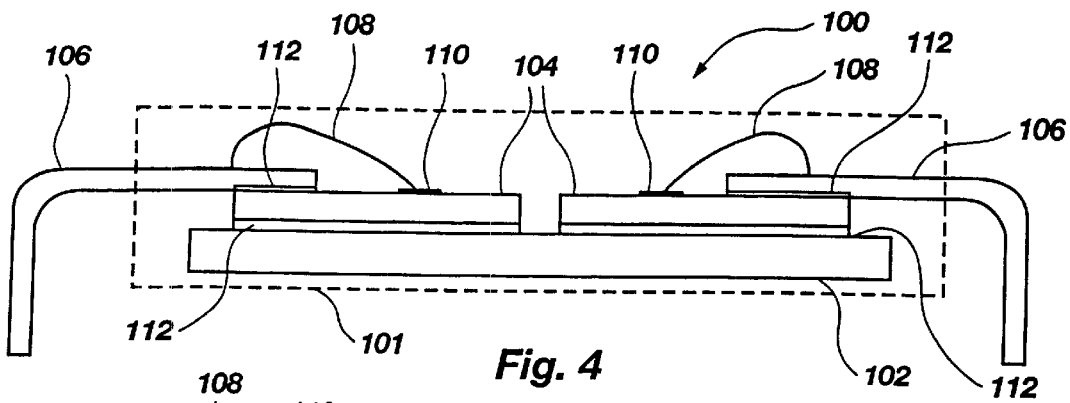
FIG. 4 illustrates a cross-sectional schematic diagram of a pair of semiconductor devices mounted in tandem according to the present invention.

Referring to drawing FIG. 4, illustrated is a semiconductor device assembly 100 of the present invention. The assembly 100 comprises a conductor carrying substrate 102 and a first and second semiconductor die 104, which are both attached to the conductor-carrying substrate 102. Each semiconductor die 104 is further attached to the leads of a lead-over-chip (LOC) lead frame 106, the leads of the lead frame 106 being mechanically attached, by adhesive 112 bonding either directly to the active surface of the semiconductor die 104 or through the use of an adhesively coated tape 112 located between the active surface of the die 104 and the leads of the lead frame 106, along a portion of a respective die 104. Next, a wire bond 108 is attached to extend between a bond pad 110 on each semiconductor die 104 and a lead of the lead frame 106. Since a plurality of bond pads 110 are located on the active surface of a semiconductor die 104, a plurality of wire bonds 108 will thus be provided to connect to a plurality of leads of the lead frame 106. Next, an encapsulant material, shown by dotted line 101, is used to seal the substrate 102, the multiple semiconductor dice 104, and wire bonds 108. Subsequently, the leads of lead frame 106 are trimmed and formed into any variety of shapes, such as that depicted in FIG. 4 or, alternately, a J-shaped lead, a Z-shaped lead, an S-shaped lead, or the like.

Each semiconductor die 104 attaches to the carrier substrate 102 using an appropriate adhesive 112 or any other well known standard die attach processes. The adhesive 112 is selected to have an appropriate coefficient of thermal expansion (CTE) to closely match the coefficient of thermal expansion of the carrier substrate 102 and the semiconductor die 104 as well as to provide good heat-conductive properties while providing electrical insulation between the active surface of a die 104 and the substrate 102. Adhesive 112 may alternately be an adhesively coated tape. The adhesive 112 may be composed of an electrically insulating material or a heat dissipating material such as a heat sink or combinations of both. A conductive epoxy, such as a silver type die attach epoxy, may also be employed to attach the die 104 to the substrate 102.

After the wire bonding process, typically, the semiconductor device assembly 100 is encapsulated using a suitable encapsulation material, shown by outline 101. One type of encapsulation material is molded plastic filled with inert material, which is commonly used for encapsulating semiconductor die and the like. Other encapsulation materials may also be used, such as ceramics or metal enclosures or combinations of both. The encapsulation material does not cover the outer ends of the leads of the lead frame 106, which protrude from the encapsulation material. The protruding portions of outer ends of the leads of the lead frame 106 provide electrical connection of the semiconductor die 104 encapsulated in the semiconductor device assembly 100 to a printed circuit board (not shown).

Figure 5:
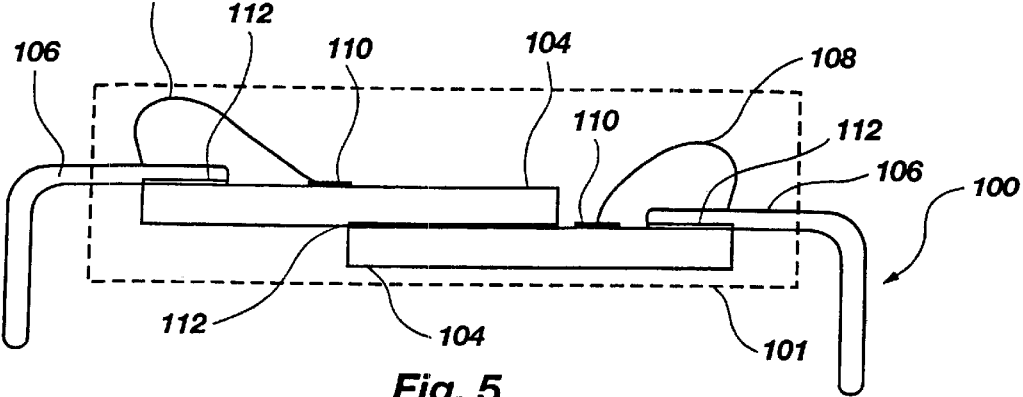
FIG. 5 is an alternative embodiment of a multi-chip lead-on-chip assembly according to the present invention.

Referring to drawing FIG. 5, an alternative embodiment of the semiconductor device assembly 100 is depicted. In the alternative embodiment illustrated in drawing FIG. 5 of the present invention, no carrier substrate 102 is used, but rather the two semiconductor dice 104 are attached to each other with the back side of one die 104 mating to the active surface of the other die 104. The active surface of the semiconductor die 104 is protected by an oxide coating or other protective coating, such as the adhesive layer 112, or adhesively coated tape 112. This allows one semiconductor die 104 to have its active region attached to a back side of another die 104 with adhesive 112 or adhesive coated tape 112 therebetween. Wire bonds 108 are attached to individual leads of the lead frame 106 and attached to the bond pads 110 on each of the semiconductor dice 104. The leads of the lead frame 106 are attached by adhesive 112 or adhesively coated tape 112 to an edge of the active surface of each semiconductor die 104. The leads of the lead frame 106 are not spaced relatively close to the bond pads 110 on the semiconductor die 104, thereby allowing for easy attachment of the wire bonds 108 during the wire bonding process. The semiconductor device assembly 100 is encapsulated in a suitable encapsulation material as shown by outline 101.

Figure 6:
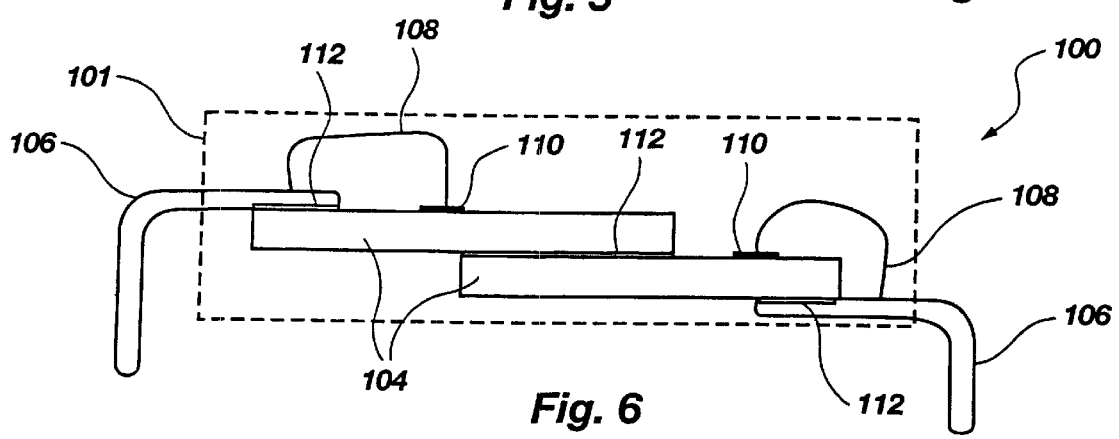
FIG. 6 is an alternative embodiment of a pair of semiconductor devices attached using lead-on-chip lead frames.

Referring to drawing FIG. 6, yet an alternative embodiment of the semiconductor device assembly 100 of the present invention is depicted where a portion of the leads of a lead frame 106 is attached by adhesive 112 or adhesively coated tape 112 to a portion of the active surface of a semiconductor die 104, while another portion of the leads of lead frame 106 is attached by adhesive 112 or adhesively coated tape 112 to the back side of another semiconductor die 104. Alternately, well known standard die attach processes using a conductive epoxy, such as a silver based epoxy, may also be used. Wire bonds 108 are then used to electrically connect the bond pads 110 of each semiconductor die 104 to the leads of the lead frame 106. The back side of one semiconductor die 104 is attached to a portion of the active surface of another semiconductor die 104 by a suitable adhesive 112 or adhesively coated tape 112. The semiconductor device assembly 100 is encapsulated in a suitable encapsulation material shown by outline 101.

Figure 7:
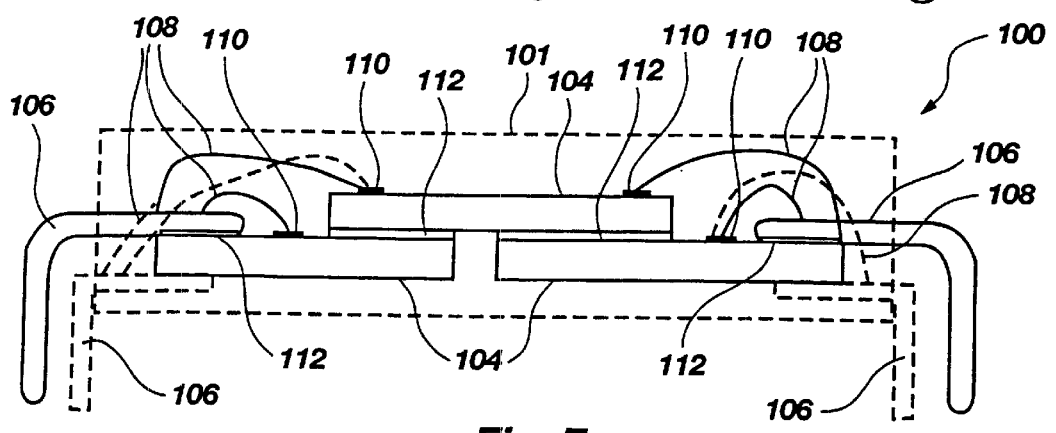
FIG. 7 is an alternative embodiment of a plurality of semiconductor devices interconnected to a lead-on-chip lead frame structure.

Referring to drawing FIG. 7, yet another alternative embodiment of the semiconductor device assembly 100 of the present invention is illustrated. In this alternative embodiment of the semiconductor device assembly 100 of the present invention, two semiconductor dice 104, located in a common horizontal plane, each have a portion of the active surface thereof attached to a portion of the back side of a third semiconductor die 104 located thereabove through the use of a suitable adhesive 112 or adhesively coated tape 112. A portion of the leads of the lead frame 106 is attached using an adhesive 112 or adhesively coated tape 112 to a portion of the active surface of the semiconductor die 104 while another portion of the leads of the lead frame 106 is attached by an adhesive 112 or adhesively coated tape 112 to a portion of the adjacent semiconductor die 104. A plurality of wire bonds 108 is then used to attach the bond pads 110 of each semiconductor die 104 to the leads of the lead frame 106. In this case, preferably, the top semiconductor die 104 has bond pads 110 fabricated along the outside edges of the die 104 while the bottom two dice 104 have substantially center-aligned bond pads 110 formed thereon. If desired, the bond pads 110 on the top semiconductor die 104 may be at any location thereon; however, the wire bonds 108 may increase in length between the bond pads 110 and the leads of the lead frame 106. The leads of the lead frame 106 attach to the edge of the active surface of each of the semiconductor dice 104 located below the upper dice 104 in the configuration. Alternatively, as illustrated in dotted lines, the leads of the lead frame 106 may be attached on the back side of the lower semiconductor die 104 with wire bonds 108 extending between the bond pads 110 of each die 104 and the leads of the lead frame 106. The semiconductor device assembly 100 is encapsulated in a suitable encapsulation material as shown by outline 101.

Figure 8:
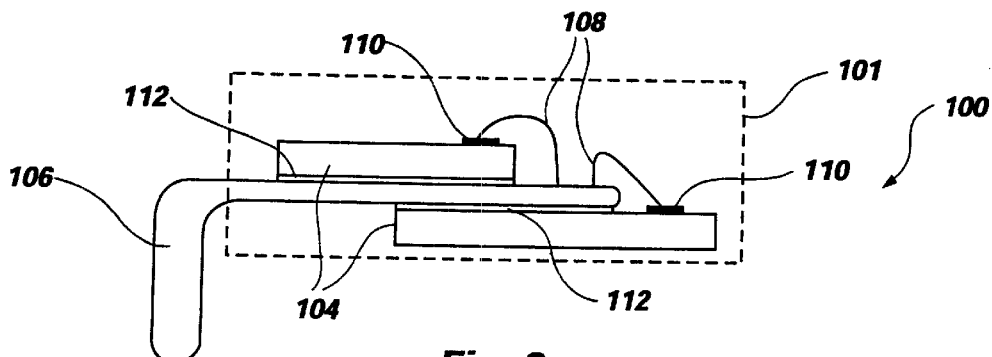
FIG. 8 is an alternative embodiment of a pair of semiconductor devices attached to a single in-line lead-on-chip lead frame.

Referring to drawing FIG. 8, yet another alternative embodiment of the semiconductor device assembly 100 of the present invention is depicted that includes two semiconductor dice 104 and a plurality of leads of a lead frame 106. A first semiconductor die 104 has a portion of the back side thereof attached to a portion of the upper surfaces of the leads of the lead frame 106 by a suitable adhesive 112 or adhesively coated tape 112 or well known standard die attach epoxies or conductive epoxy, such as a silver based epoxy, while a second semiconductor die 104 has a portion of the active surface thereof attached to the lower surfaces of the leads of the lead frame 106 by a suitable adhesive 112 or adhesively coated tape 112. The first semiconductor die 104 is positioned so that an exposed portion of lead frame 106 extends a sufficient enough distance beneath the back side of the first die 104 to allow a plurality of wire bonds 108 to connect the bond pads 110 of each die 104 to the leads of the lead frame 106. This is advantageous in that a single in-line module may be formed utilizing the advantage of placing two or more, or any desired number of, semiconductor dice 104 in a substantially adjacent configuration with the active surface of each die 104 and their associated bond pads 110 thereon facing the same direction for forming wire bonds 108 during a wire bond process. The semiconductor device assembly 100 is encapsulated in a suitable encapsulation material as shown by outline 101.

Figure 9:
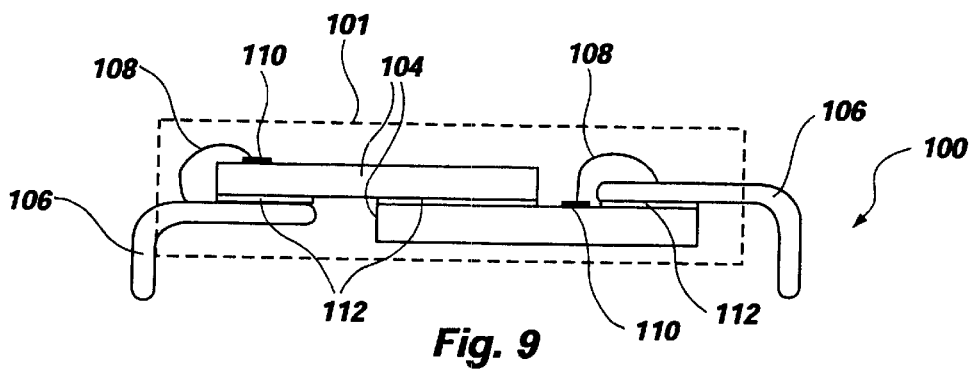
FIG. 9 depicts an alternative embodiment of the lead-on-chip multi-chip package according to the present invention.

Referring to drawing FIG. 9, an alternative embodiment of the semiconductor device assembly 100 of the present invention is illustrated. The semiconductor device assembly 100 includes the leads of a lead frame 106 attached through the use of a suitable adhesive 112 or adhesively coated tape 112 or other well standard die attach epoxies to the back side of the first or top semiconductor die 104 and other leads of the lead frame 106 attached through the use of a suitable adhesive 112 or adhesively coated tape 112 to a portion of the active surface of a second or bottom semiconductor die 104. The first semiconductor die 104 has a portion of the back side thereof attached to a portion of the active surface of the second semiconductor die 104 using a suitable adhesive 112 or adhesively coated tape 112. Such a semiconductor device assembly 100 of the present invention provides a more compact design since the profile height of the overall structure is reduced. In this embodiment of the semiconductor device assembly 100 of the present invention, preferably, the one semiconductor die 104 has bond pads 110 on the edge of the active surface thereof while the other semiconductor die 104 has generally centered or centrally-oriented bond pads 110 on the active surface thereof. Wire bonds 108 extend between the bond pads 110 of the semiconductor die 104 and the leads of the lead frame 106. The semiconductor device assembly 100 is encapsulated in a suitable encapsulation material as shown by outline 101.

Figure 10:
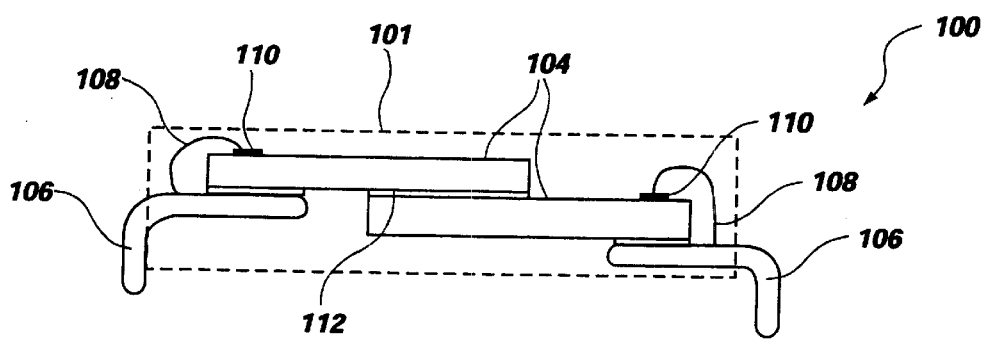
FIG. 10 depicts an alternative embodiment of a lead-on-chip lead frame package according to the present invention.

Referring to drawing FIG. 10, another alternative embodiment of the semiconductor device assembly 100 of the present invention includes the leads of the lead frame 106 attached to the back side of each semiconductor die 104 using a suitable adhesive 112 therebetween or an adhesively coated tape 112 or well known standard die attach epoxies or conductive epoxies as described hereinbefore located therebetween while a portion of the back side of the first semiconductor die 104 is attached to a portion of the active surface of the second semiconductor die through the use of a suitable adhesive 112 or an adhesively coated tape 112. In this manner, each semiconductor die 104, the first semiconductor die and the second semiconductor die, preferably has edge-oriented bond pads 110 on the active surface thereof for the wire bonds 108 extending between the leads of the lead frame 106 and the bond pads 110 of the die 104 for a rapid wire bonding process during the wire bonding stage. In all but the embodiment shown in drawing FIG. 8, the resulting semiconductor device assembly 100 produces a dual in-line parallel lead configuration for the semiconductor die 104. The semiconductor device assembly 100 is encapsulated in a suitable encapsulation material as shown by outline 101.

Figure 11:
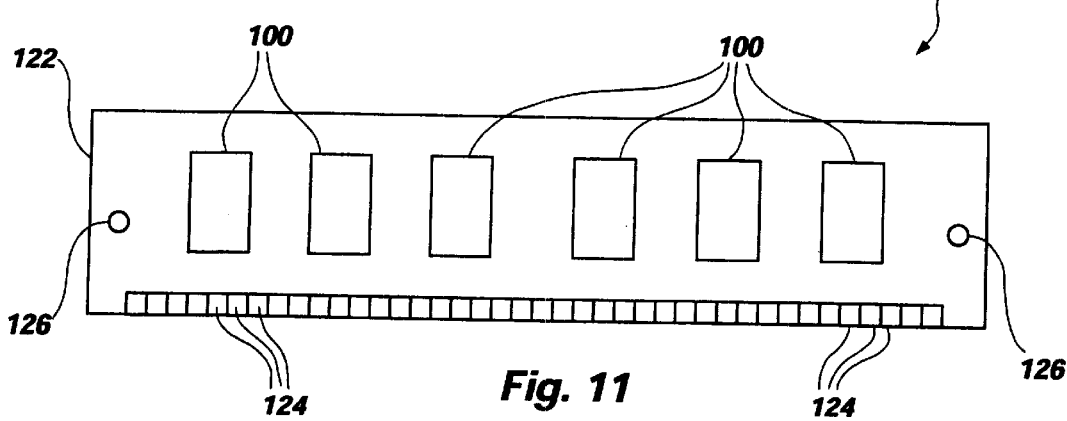
FIG. 11 depicts a schematic diagram of a single in-line memory module utilizing a multi-chip package according to the present invention.

Once the assembly 100 has been encapsulated, it then may be installed on a circuit board, such as shown in drawing FIG. 11. As illustrated in drawing FIG. 11, a single in-line memory module (SIMM) 120 includes a plurality of semiconductor device assemblies 100 electrically and mechanically attached to a printed circuit board 122. Printed circuit board 122 further includes a plurality of edge connectors 124, which are electrically connected to the plurality of semiconductor device assemblies 100. A pair of clip holes 126 are provided on either end of circuit board 122, and are used to securely fasten the SIMM 120 within a memory slot on a computer system.

Figure 12:
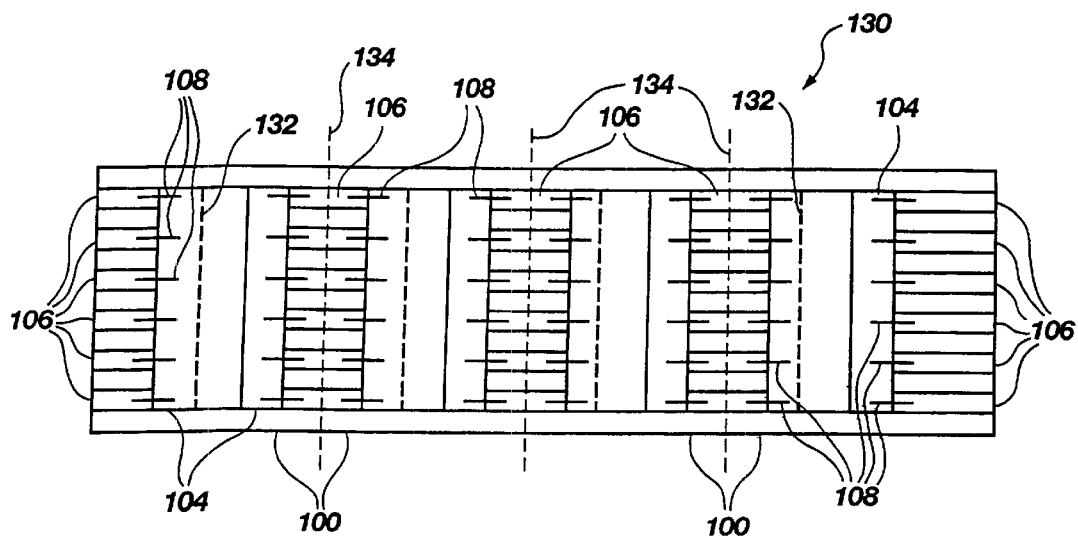
FIG. 12 depicts a schematic diagram of multiple multi-chip assemblies in a lead frame tape strip according to the present invention.

Referring to drawing FIG. 12, a plurality of semiconductor device assemblies 100 are illustrated in a tape array format 130. Each semiconductor device assembly 100 includes a pair of semiconductor dice 104, attached one over the other denoted by the dotted line 132. The two semiconductor dice 104 are mechanically attached to the leads of lead frames 106, forming a portion of the tape assembly 130. Next, the wire bonding process is performed that attaches wire bonds 108 from each semiconductor die 104 to the leads of the lead frames 106. Then, the leads of the lead frames 106 are severed, such as shown along the dotted line 134, during a trimming operation. The leads of the lead frames 106 are formed into a desired shape after the encapsulation of the leads of the lead frames 106 and semiconductor dice 104.

Figure 13:
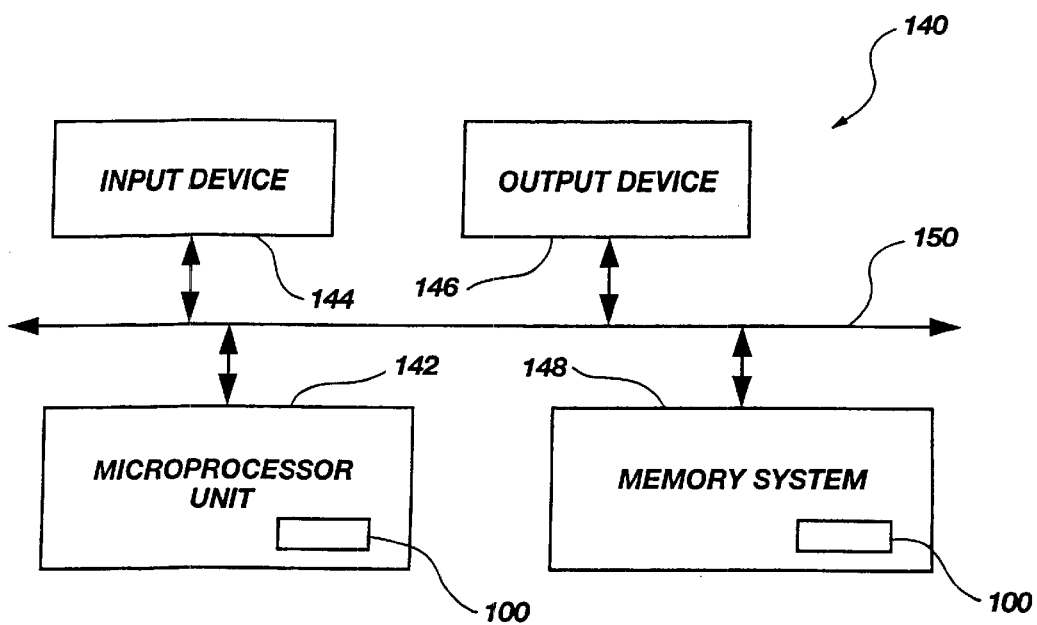
FIG. 13 depicts a computer system incorporating the multi-chip package according to the present invention.

Referring to drawing FIG. 13, a computer system 140 is illustrated. The computer system 140 includes one or more semiconductor device assemblies 100 manufactured according to the present invention as described hereinbefore. Computer system 140 includes a microprocessor unit 142, which may utilize the multi-chip packaging semiconductor device assembly 100. Computer 140 further comprises an input device 144 and an output device 146, which are both attached to a bus system 150. Bus system 150 is attached further to microprocessor unit 142 and to a memory system 148. Memory system 148 may also incorporate the multi-chip semiconductor device assembly 100 according to the present invention.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A method of making a semiconductor device assembly having a first semiconductor die having at least one bond pad on an active surface thereof and having a back side and having a second semiconductor die having at least one bond pad on an active surface thereof and having a back side, said first semiconductor die and said second semiconductor die mounted on a lead frame having a plurality of leads, said method comprising:

providing a carrier substrate having a first side and a second side;

attaching the back side of the first semiconductor die and the back side of the second semiconductor die to the first side of the carrier substrate;

attaching at least one lead of the plurality of leads to a portion of the active surface of the first semiconductor die;

attaching at least one other lead of the plurality of leads to a portion of the active surface of the second semiconductor die;

forming at least one wire bond extending between the at least one bond pad on the active surface of the first semiconductor die and the at least one lead of the plurality of leads of the lead frame attached to a portion of the active surface of the first semiconductor die; and forming at least one wire bond extending between the at least one bond pad on the active surface of the second semiconductor die and the at least one other lead of the plurality of leads of the lead frame attached to a portion of the active surface of the second semiconductor die.

2. The method of claim 1, further comprising:

adhesively bonding the first semiconductor die to the at least one lead of the plurality of leads using an adhesive located between the first semiconductor die and the at least one lead of the plurality of leads of the lead frame; and adhesively bonding the second semiconductor die to the at least one other lead of the plurality of leads using an adhesive located between the second semiconductor die and the at least one other lead of the plurality of leads of the lead frame.

3. The method of claim 2, wherein the adhesive includes a tape coated with an adhesive.

4. The method of claim 1, further comprising:

adhesively bonding the back side of the first semiconductor die to the first side of the carrier substrate using an adhesive located between the back side of the first semiconductor die and the carrier substrate; and adhesively bonding the back side of the second semiconductor die to the first side of the carrier substrate using an adhesive located between the back side of the second semiconductor die and the carrier substrate.

5. The method of claim 4, wherein the adhesive includes a tape coated with an adhesive.

* * * * *